United States Patent
Ishikawa et al.

(10) Patent No.: US 8,104,663 B2
(45) Date of Patent: Jan. 31, 2012

(54) SOLDER BALL MOUNTING METHOD AND APPARATUS

(75) Inventors: Shinji Ishikawa, Tokyo (JP); Eiji Hashino, Tokyo (JP); Kohei Tatsumi, Tokyo (JP)

(73) Assignee: Nippon Steel Materials Co., Ltd., Tokyo (JP)

( * ) Notice: Subject to any disclaimer, the term of this patent is extended or adjusted under 35 U.S.C. 154(b) by 0 days.

(21) Appl. No.: 12/599,396

(22) PCT Filed: May 8, 2008

(86) PCT No.: PCT/JP2008/058555
§ 371 (c)(1),
(2), (4) Date: Nov. 9, 2009

(87) PCT Pub. No.: WO2008/140019
PCT Pub. Date: Nov. 20, 2008

(65) Prior Publication Data
US 2010/0127049 A1 May 27, 2010

(30) Foreign Application Priority Data
May 8, 2007 (JP) ................................. 2007-123747

(51) Int. Cl.
*B23K 1/00* (2006.01)
*B23K 31/02* (2006.01)
(52) U.S. Cl. ........... 228/41; 41/246; 41/248.1; 438/612; 438/613

(58) Field of Classification Search .................. 228/246, 228/248.1, 41, 245, 180.22; 438/612, 613
See application file for complete search history.

(56) References Cited

U.S. PATENT DOCUMENTS

| | | | |
|---|---|---|---|
| 5,431,332 A * | 7/1995 | Kirby et al. | 228/246 |
| 5,655,704 A * | 8/1997 | Sakemi et al. | 228/246 |
| 5,918,792 A * | 7/1999 | Stumpe et al. | 228/41 |
| 6,460,755 B1 * | 10/2002 | Inoue et al. | 228/246 |
| 6,595,404 B2 | 7/2003 | Suzuki et al. | |
| 6,695,200 B2 | 2/2004 | Suzuki et al. | |
| 7,475,803 B2 * | 1/2009 | Sumita et al. | 228/246 |
| 2001/0008160 A1 | 7/2001 | Suzuki et al. | |
| 2002/0084315 A1 * | 7/2002 | MaCkay et al. | 228/254 |
| 2003/0029908 A1 | 2/2003 | Suzuki et al. | |

FOREIGN PATENT DOCUMENTS
JP 9-162533 A 6/1997
(Continued)

*Primary Examiner* — Roy King
*Assistant Examiner* — Michael Aboagye
(74) *Attorney, Agent, or Firm* — Birch, Stewart, Kolasch & Birch, LLP

(57) ABSTRACT

The periphery of a mask (3) is formed higher than a region where a ball holding hole (3a) is formed, a work (1) is arranged at a lower section of the ball holding hole (3a) of the mask (3), and the ball holding hole (3a) and an electrode of the work (1) are aligned with each other. A ball (B) is applied on the mask (3), and in such state, vibration is applied to the mask (3) to move the solder ball (B) on the surface of the mask (3) and drop the solder ball (B) into the ball holding hole (3a). The periphery of the mask (3) is permitted to be lower than the ball holding hole (3a), and an excessive portion of the solder ball (B) is recovered from over the mask (3).

8 Claims, 4 Drawing Sheets

FOREIGN PATENT DOCUMENTS

| | | |
|---|---|---|
| JP | 10-126046 A | 5/1998 |
| JP | 2000-294676 A | 10/2000 |
| JP | 2001-267731 A | 9/2001 |
| JP | 2002-57176 A | 2/2002 |
| JP | 2005-244006 A | 9/2005 |
| JP | 2006-287215 A | 10/2006 |

* cited by examiner

SOLDER BALL MOUNTING METHOD AND APPARATUS

TECHNICAL FIELD

The present invention relates to a solder ball mounting method and apparatus for mounting solder balls on electrodes formed on a surface of a printed circuit board, a semiconductor wafer or the like.

BACKGROUND ART

Various methods and solder ball mounting methods and apparatuses for mounting solder balls on electrodes formed on a surface of a printed circuit board, a semiconductor device or the like (hereinafter referred to as the "work") have been proposed and implemented. Among them, there is a so-called dropping method disclosed in Patent Documents 1 to 4, for example, in which a surface of a work is covered with a mask including multiple ball holding holes through which solder balls can pass, the multiple ball holding holds are aligned with multiple electrodes on the work, and solder balls are moved across the surface of the mask to drop the solder balls into the ball holding holes.

These ball mounting methods use a squeegee, blush, blade, wire or the like to move solder balls on the mask to drop the solder balls into ball holding holes. Another method has been used in which a mask is tilted or swung to drop solder balls into holding holes.

Yet another method has been proposed in which a mask and a work are swung together while controlling the movement of the balls using a squeegee as disclosed in Patent Document 5.

Patent Document 1: Japanese Laid-open Patent Publication No. 9-162533

Patent Document 2: Japanese Laid-open Patent Publication No. 10-126046

Patent Document 3: Japanese Laid-open Patent Publication No. 2001-267731

Patent Document 4: Japanese Laid-open Patent Publication No. 2005-244006

Patent Document 5: Japanese Laid-open Patent Publication No. 2000-294676

SUMMARY OF THE INVENTION

In the existing technique described above, solder balls are in contact with ball moving means such as a blush, squeegee, blade, wire or the like and are moved by pushing by the ball moving means. Accordingly, balls can be damaged or broken when the balls are dropped into the ball holding holes in the mask. In addition, foreign matters have gotten into solder balls from the ball moving means. Especially when small solder balls that are 200 μm or less in diameter are to be mounted, the solder balls are often damaged or broken in the methods. Therefore, the method described above have the drawback that only relatively large solder balls with diameters larger than 200 μm can be practically mounted.

On the other hand, the method in which a mask is tilted and swung in isolation from or together with a work has the drawback that it takes impractically long time to drop solder balls, especially small solder balls with diameters of 200 μm or less, into all holding holes because it is hard to uniformly distribute small balls due to their lightness in weight.

In the dropping method, it is important to keep the distance between the mask and the surface of a work uniform in order to drop and hold solder balls without excess or lack. However, the method in which a squeegee, wire or the like is pressed against the surface of the mask to move solder balls has the drawback that the pressure brings the mask into contact with the surface of the work. Therefore, a spacer is provided in order to keep the distance between the mask and the surface of a work uniform, as disclosed in Patent Document 2.

However, if a mask is close to a work as in the case where small-diameter solder balls are used, the spacer needs to be provided inside the work, for example at the boundary between chips. Therefore, flux cannot be applied to the entire surface of the work but needs to be applied only to electrode regions. Furthermore, if the flux applied only to electrodes spread to surrounding regions, the flux adheres to the spacer. Therefore, the flux to be applied is subject to various constraints.

The present invention has been made in light of these circumstances and an object of the present invention is to provide a solder ball mounting method and apparatus capable of uniformly distributing and moving solder balls across a surface of a mask so that solder balls can be dropped in all ball holding holes provided in the mask in a short time without fail.

To achieve the object, the present invention provides a solder ball mounting method using a mask including a plurality of ball holding holes, each being passable by a solder ball, for mounting the solder balls on a work including a plurality of electrodes, at least the plurality of electrodes being coated with flux, the method including at least: raising a part surrounding the mask higher than a region where the ball holding holes are formed; positioning the work under the ball holding holes of the mask and aligning the electrodes of the work with the ball holding holes; supplying the solder balls onto the mask; while the solder balls are being supplied onto the mask, vibrating the mask to move the solder balls across the surface of the mask to drop the solder balls into the solder ball holding holes; and lowering the part surrounding the mask lower than the ball holding hales to collect excess solder balls from the mask.

The present invention provides a solder ball mounting method wherein the frequency of vibration applied to the mask is greater than or equal to 20 Hz.

The present invention provides a solder ball mounting method wherein the part surrounding the mask is raised and lowered by 0.4 mm or greater from the ball holding holes.

The present invention provides a solder ball mounting method wherein the work uniformly coated with the flux is used.

The present invention provides a solder ball mounting apparatus using a mask including a plurality of ball holding holes, each being passable by a solder ball, for mounting the solder balls on a work, the apparatus including at least: a stage on which the work is to he placed; a stage raising and lowering mechanism raising and lowering the stage; a plurality of mask frames holding the mask; a mask raising and lowering mechanism raising and lowering the mask frame with respect to the ball holding holes; a ball supplying mechanism supplying the solder balls onto the mask; a positioning mechanism aligning the electrodes of the work with the ball holding holes; a mask vibrating mechanism vibrating the mask; and a ball collecting mechanism collecting excess solder ball from the mask.

DETAILED DESCRIPTION OF THE PREFERRED EMBODIMENTS

Preferred embodiments of ball mounting method and apparatus according to the present invention will be described with reference to drawings.

Figure 1:
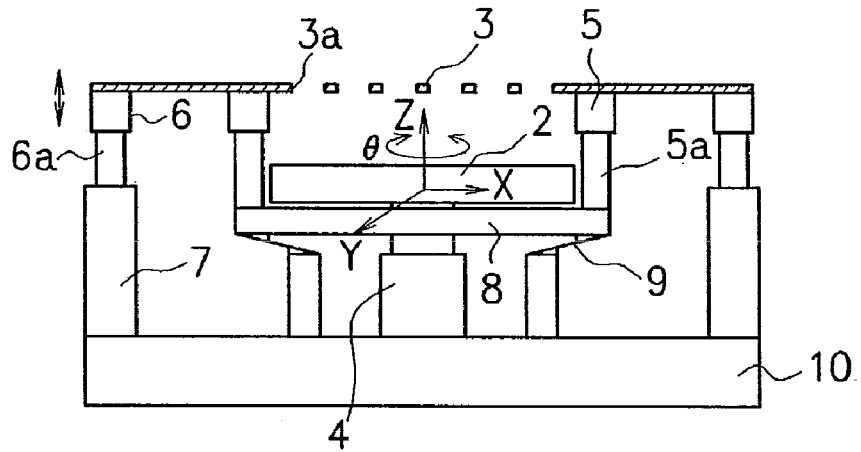
FIG. 1 is a diagram illustrating a mounting apparatus according to an embodiment of the present invention before a work and solder balls are provided.

FIGS. 1 to 9 illustrate an example of a solder ball mounting process according to the present invention. FIG. 1 depicts an initial state of the process performed in a solder ball mounting apparatus. Solder balls B (see FIG. 5 and others) handled by the present invention are spherical in shape with a diameter of approximately 60 μm to 760 μm. While the present invention will be described herein with respect to a work which is a wafer 1 (see FIG. 3 and others), the same description also applies to a case where the work is a substrate.

Figure 3:
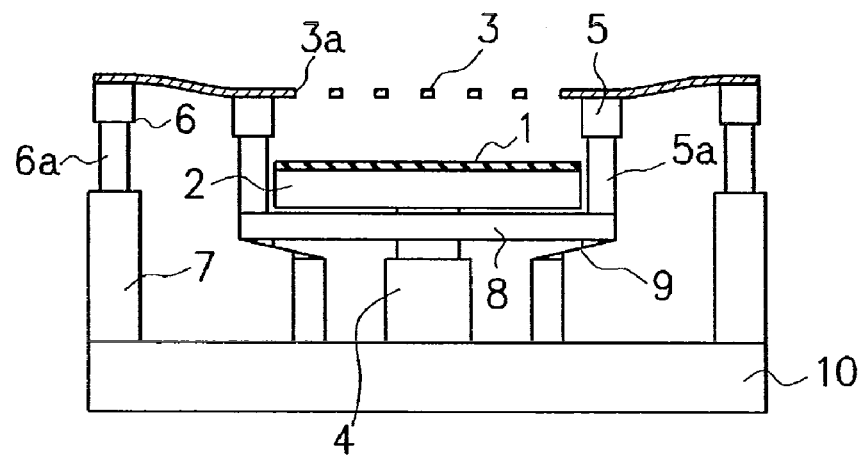
FIG. 3 is a diagram illustrating a state in which a wafer is placed on a work stage in the embodiment of the present invention.

Referring primarily to FIG. 1, a solder ball mounting apparatus of the present invention will be outlined. A work (wafer 1) is placed on a work stage 2 (FIG. 3). Typically, the work stage 2 is substantially circular in shape and is designed to hold the wafer 1 on the work stage 2 by suction using a vacuum or other method. A stage raising and lowering mechanism 4 which supports the work stage 2 is provided. The stage raising and lowering mechanism 4 is capable of moving the work stage 2 up and down to a desired height through a screw mechanism, for example.

The stage raising and lowering mechanism 4 includes a positioning mechanism (not shown) which can fine-adjust the work stage 2 in the two horizontal orthogonal axes X, Y directions and the rotational θ direction. The positioning mechanism enables the work stage 2 (electrodes on the wafer 1) and ball holding holes in a mask 3, which will be described later, to be aligned with each other. A verification method such as image processing can be used for verifying the alignment.

A mask frame 5 supporting a mask 3 is disposed horizontally above the work stage 2 at a close distance from the work stage 2. The mask frame 5 is ring-like or annular in shape, is disposed substantially concentrically with the work stage 2, and surrounds the work stage 2. A supporting member 5a supporting the mask frame 5 is disposed aside of the work stage 2. The mask 3 is fixed on top of the mask frame 5 with an adhesive or the like and includes a plurality of ball holding holes 3a that correspond to electrodes on the wafer 1. While the ball holding holes 3a are typically circular in shape, the ball holding holes 3a may be rectangular (such as square).

Another mask frame 6 is horizontally disposed on the outer side of the mask frame 5 for supporting the outer regions of the mask 3. The mask frame 6 is typically ring-like or annular in shape (or it may be rectangular) and disposed substantially concentrically with the mask frame 5. The mask frame 6 is supported by a mask raising and lowering mechanism 7 through a supporting member 6a in such a manner that the mask frame 6 can be moved up and down. The mask raising and lowering mechanism 7 include a feed screw mechanism, for example, and is capable of moving the mask frame 6 up and down to a desired height.

The mask frame 5 is fixed and supported through the supporting member 5a on a base plate 8. The base plate 8 is supported by an apparatus base 10 through a mask vibrating mechanism 9. That is, the mask frame 5 can be vibrated by operation of the mask vibrating mechanism 9. The mask vibrating mechanism 9 may be a vibrating mechanism including a vibrator and a plate spring used in a parts feeder used on assembly lines.

Figure 5:
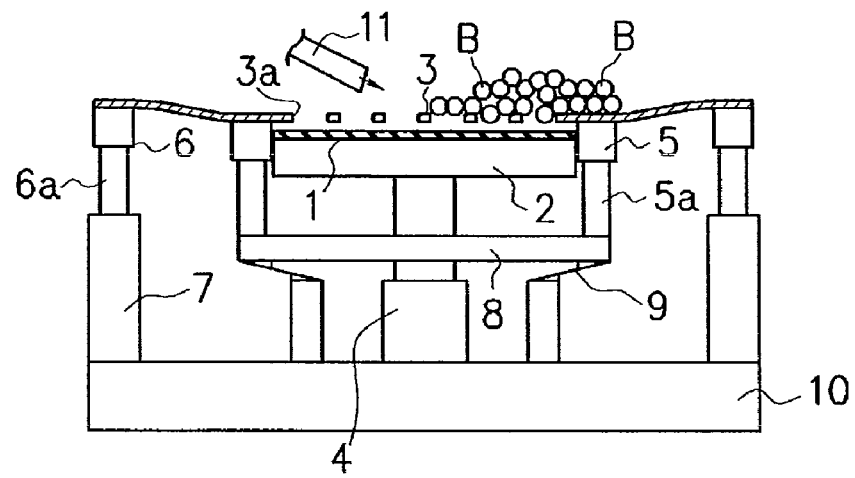
FIG. 5 is a diagram illustrating a state in which solder balls to be mounted onto the wafer are being provided onto the mask in the embodiment of the present invention.

Further provided is a solder ball supplying mechanism which supplies solder balls to the solder ball mounting apparatus and is capable of supplying solder balls onto the mask 3 through a chute 11, for example, from a solder ball stocker (not depicted) as depicted in FIG. 5.

Figure 7:
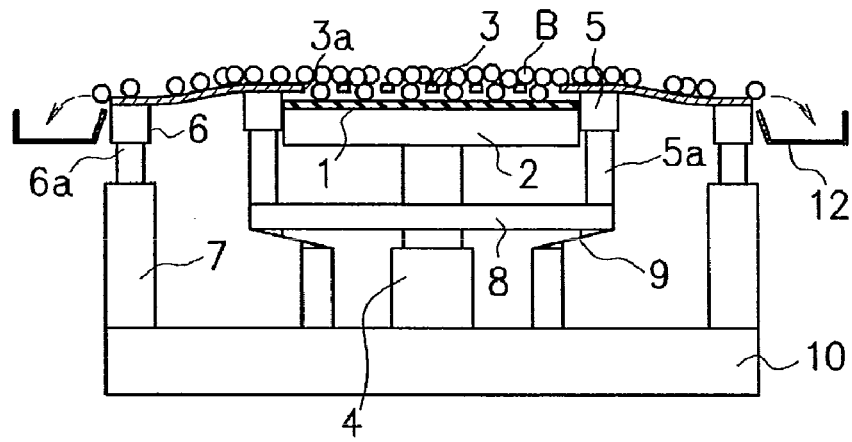
FIG. 7 is a diagram illustrating a state in which excess solder balls are being collected in the embodiment of the present invention.

Also provided is a ball collecting mechanism for collecting solder balls which is capable of collecting solder balls B into a ring tray 12, for example, as depicted in FIG. 7.

A solder ball mounting operation of the solder ball mounting apparatus having the configuration described above will be described by following a process of a method of the present invention.

Figure 2:
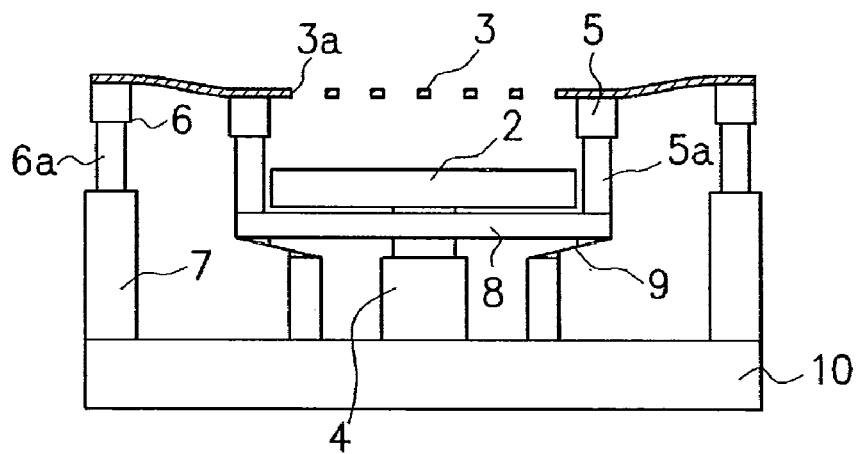
FIG. 2 is a diagram illustrating a state in which a mask frame is raised in the embodiment of the present invention.

FIG. 2 illustrates a state in which the mask frame 6 is raised with respect to the mask frame 5 after the initial state of the process in FIG. 1. The mask frames 5 and 6 to which the mask 3 is fixed with an adhesive or the like as described above are used. First, the mask raising and lowering mechanism 7 raises the mask frame 6 with respect to the mask frame 5. The mask frame 5 is fixed. As a result, the outer regions of the mask 3 are moderately raised with respect to the region where ball holding holes 3a are formed and the mask 3 becomes dish-shaped.

FIG. 3 illustrates a state in which a work (wafer 1) is placed on the work stage 2. Flux, not depicted, has been applied at least to electrode regions of the wafer 1 beforehand. The flux can temporarily hold solder balls B placed on electrodes of the wafer 1 until the solder balls B is melted and solidified.

The method of the present invention does not involve an operation that presses the mask 3 against the wafer 1. Accordingly, a spacer does not need to be provided between the mask 3 and the wafer 1. Therefore flux can be applied to the entire surface of the wafer 1. If flux were applied to electrode regions as dots using a stencil by a printer for example, the dotted flux would soften and flow during a reflow process in which solder is melted and then solidified into spherical bumps. As a result, solder balls placed on the flux could move with the flowing flux, which could cause defects in bridges or other elements.

In the present embodiment, splaying or spin coating can be used which can apply flux to the entire work to a uniform thickness. It is more preferable to use a work uniformly coated with flux because the flux does not flow when the flux soften during reflow and therefore defects do not occur. Furthermore, printing can cause flux to spread depending on the quality of the printing and therefore the type and components of flux that can be used are limited. In the present invention, on the other hand, any applying method can be chosen that is suitable for flux.

Figure 4:
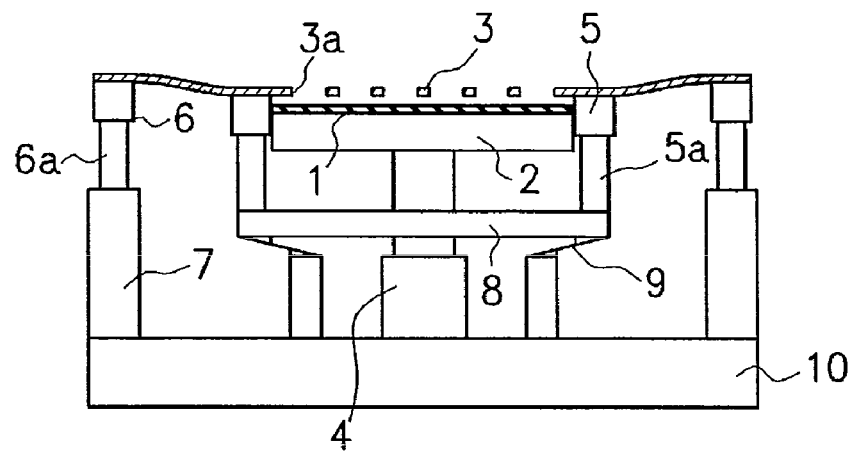
FIG. 4 is a diagram illustrating a state in which the work stage is raised and positioned in place in the embodiment of the present invention.

FIG. 4 illustrates a state in which the work stage 2 is raised by the stage raising and lowering mechanism 4 to a predetermined height. In doing this, the positioning mechanism described above moves the work stage 2 up, down, left, and right and rotates the work stage 2 horizontally to align the electrodes on the wafer 1 with the ball holding holes 3a of the mask 3.

FIG. 5 illustrates a state in which solder balls B are supplied by the solder ball supplying mechanism through the chute 11. The number of solder balls B to be supplied is preferably more than twice the number of the ball holding holes 3a in order to drop solder balls B into all ball holding holes 3a in a short time.

The distance (in the vertical direction) between the mask 3 and the wafer 1 is set to an appropriate value which depends on the size of solder balls to be mounted. During dropping, the top of each solder ball B is preferably flush with the upper surface of the mask 3 or higher than the upper surface of the mask 3 by approximately 0.5 times the diameter of the ball. Such a height can prevent more than one solder ball B from entering one ball holding hole 3a. In a method using a blush or squeegee to drop solder balls, the blush or squeegee can damage solder balls B if the top of the solder balls is above the upper surface of the mask 3. The method of the present invention does not cause the problem.

The height to which the mask frame 6 is to be raised with respect to the mask frame 5 depends on the diameter of the solder balls B used and the intensity of vibration applied. Preferably, the mask frame 6 is raised higher than the mask frame 5 by 0.4 mm or more so that the solder balls B remains on the mask 3 when the mask 3 is vibrated if the diameter of the solder balls B used is in the range from 60 μm to 760 μm inclusive. In order to prevent deformation of the mask 3, the height is preferably less than or equal to 3 mm. Masks for solder balls with small diameters are usually fabricated using plating. In the present method, an inexpensive single flat mask can be used because deformation of the mask 3 is small.

In order to facilitate dropping the solder balls B, the diameter of the ball holding holes 3a formed in the mask 3 is preferably greater than that of the solder balls B used. In particular, the diameter is preferably less than or equal to 1.5 times greater than the diameter of the solder balls B. The positions of the ball holding holes 3a formed in the mask 3 match the positions of electrodes formed on the wafer 1. However, the positions of the ball holding holes 3a can be fine-adjusted by a mechanism for moving the work stage 2 depending on how the wafer 1 is placed on the work stage 2.

Figure 6:
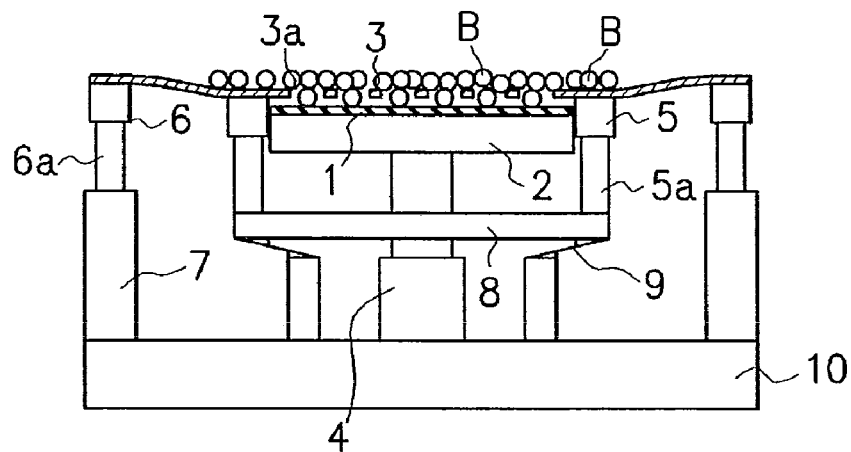
FIG. 6 is a diagram illustrating a state in which solder balls are being dropped from the mask to the wafer in the embodiment of the present invention.

FIG. 6 illustrates a state in which solder balls B are dropped into the ball holding holes 3a in the mask 3 by vibrating the mask 3 with the vibrating mechanism 9. A frequency of the mask vibrating mechanism 9 to be specified in specifications is chosen such that the solder balls B are efficiently uniformly distributed and moved, depending on the solder balls B used and the structure of the mask frame 5 and other factors.

In general, it is hard to uniformly distribute small solder balls with a diameter less than or equal to 200 μm because they are lightweight. The inventive method can uniformly distribute and drop solder balls B with a diameter of as small as 60 μm by choosing vibration appropriate to the size of the solder balls B. Up-and-down vibration of the mask 3 is preferably small because a large up-and-down vibration of the mask 3 can bring the mask 3 into contact with the surface of the wafer 1.

The preferable vibration frequency depends on the solder ball mounting apparatus. If solder balls B with a diameter less than 200 μm are used, the solder balls B will be distributed and moved at a frequency greater than or equal to 20 Hz. The amplitude of vibration is set to such a value that jumping of solder balls B is not visually observed by the naked eye, thereby preventing damage to solder balls B.

Figure 10:
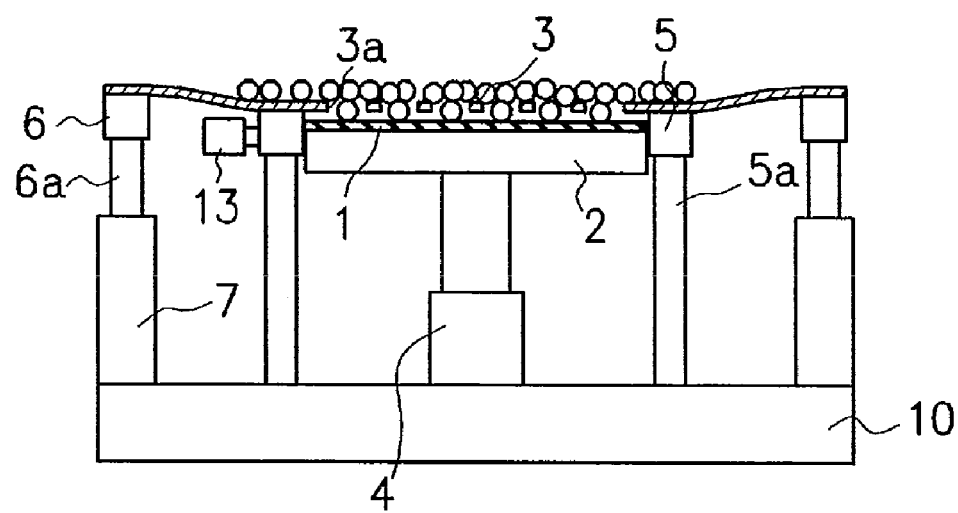
FIG. 10 is a diagram illustrating a mounting apparatus to which a vibrator is attached in the embodiment of the present invention.

Another example of the mask vibrating mechanism that can be used is a vibrator 13 depicted in FIG. 10. The vibrator 13 is disposed directly on the mask frame 5 or in an appropriate place on the supporting member 5a near the mask frame 5 as depicted in FIG. 10 to vibrate the mask frame 5. The vibrator 13 is suited for causing vibration in the ultrasonic range from 20 kHz to 200 kHz inclusive.

FIG. 7 illustrates a state in which the mask frame 6 is lowered with respect to the mask frame 5 in order to remove excess solder balls from the mask 3. This enables solder balls B to be collected in the tray 12 of the ball collecting mechanism provided outside the mask frame 6 as illustrated in FIG. 7. By collecting excess solder balls B, the waste of solder balls B can be eliminated and damage to solder balls B dropped in the ball holding holes 3a can be prevented.

In the embodiment described above, vibration caused by the mask vibrating mechanism 9 can be used in collecting solder balls B. The degree by which the mask frame 6 is lowered with respect to the mask frame 5 depends on the diameter of solder balls B used and the intensity of vibration applied. If the diameter of the solder balls B used is in the range from 60 μm to 760 μm inclusive, the mask frame 6 is lowered preferably more than 0.2 mm lower with respect to the mask frame 5 so that the solder balls B on the mask 3 are removed by vibration and preferably less than or equal to 3 mm lower with respect to the mask frame 5 in order to prevent deformation of the mask 3.

Figure 8:
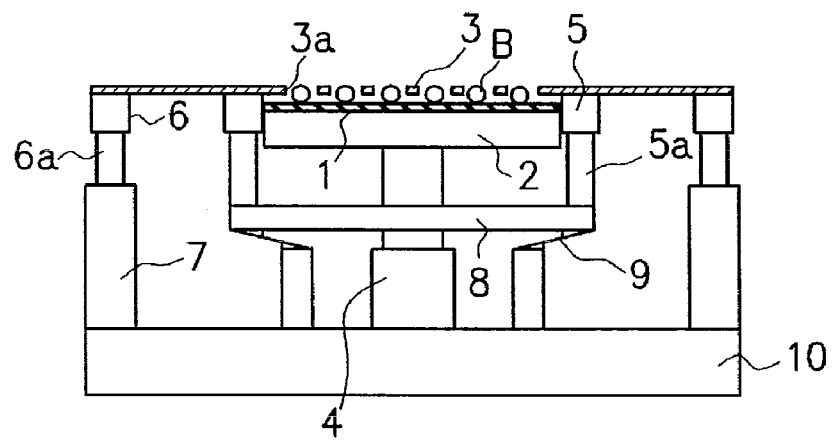
FIG. 8 is a diagram illustrating a state in which solder balls are mounted on the wafer in the embodiment of the present invention.

FIG. 8 illustrates a state after the removal of excess balls in which the mask frame 6 is returned to the height of the mask frame 5 and solder balls B are dropped in all ball holding holes 3a. The solder balls B dropped in are held on the electrodes on the wafer 1 by the adhesion of the flux applied to the surface of the wafer 1.

Figure 9:
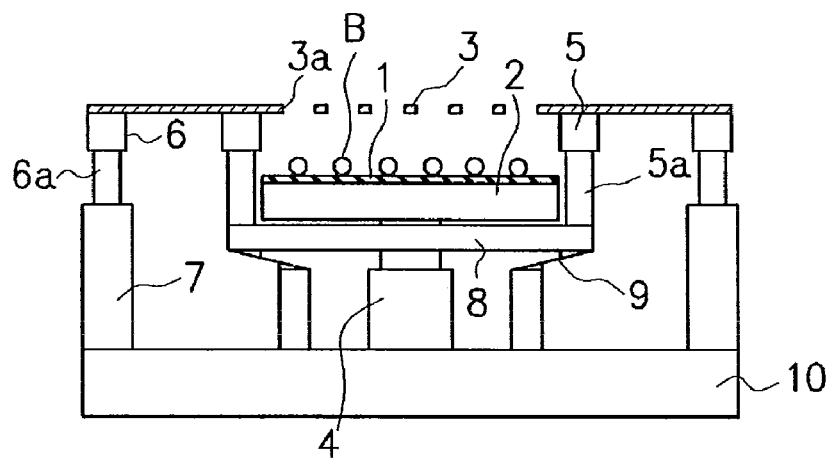
FIG. 9 is a diagram illustrating a state in which the wafer is being unloaded in the embodiment of the present invention.

FIG. 9 illustrates a state in which the work stage 2 is lowed so that the wafer 1 on which solder balls are mounted can be unloaded from the apparatus. Subsequently, the wafer 1 is subjected to reflow processing in which the solder is melted and solidified into spherical bumps.

The shapes and structures of the components described above with respect to the embodiments above are only illustrative of implementations of the present invention. The present invention is not limited to the examples and modifications can be made as appropriate.

For example, an optimum size of solder balls B and optimum vibration frequency and other parameters are used without departing from the technical scope of the present invention.

INDUSTRIAL APPLICABILITY

According to the solder ball mounting method and apparatus of the present invention, solder balls can be uniformly distributed and moved across the surface of a mask by vibrating the mask, thereby all solder balls can be dropped in all ball holding holes in a short time without fail. Furthermore, solder balls can be easily distributed and collected without damaging the solder balls simply by raising and lowering a part surrounding the mask with respect to the central portion of the mask. Therefore, good-quality solder balls can be reliably mounted on electrodes of a work in a short time and solder-ball-mounted works of high quality can be efficiently fabricated.

What is claimed is:

1. A solder ball mounting apparatus using a mask including a plurality of ball holding holes, each being passable by a solder ball, for mounting the solder balls on a work, the apparatus comprising at least:
   a stage on which the work is to be placed;
   a stage raising and lowering mechanism raising and lowering the stage;
   at least first and second mask frames directly contacting and holding the mask;
   a mask raising and lowering mechanism raising and lowering the second mask frame with respect to the first mask frame;
   a ball supplying mechanism supplying the solder balls onto the mask;
   a positioning mechanism aligning the electrodes of the work with the ball holding holes;
   a mask vibrating mechanism vibrating the mask; and
   a ball collecting mechanism collecting excess solder balls from the mask.

2. The solder ball mounting apparatus according to claim 1, wherein only the first mask frame is vibrated by operation of said mask vibrating mechanism.

3. The solder ball mounting apparatus according to claim 1, wherein said solder balls are dropped into said ball holding holes by vibrating said mask with said mask vibrating mechanism.

4. The solder ball mounting apparatus according to claim 1, wherein
   the second mask frame is lowered with respect to the first mask frame in order to remove excess solder balls from said mask, and
   vibration caused by said mask vibrating mechanism is used in collecting said excess solder balls in said ball collecting mechanism.

5. A solder ball mounting apparatus using a mask including a plurality of ball holding holes, each being passable by a solder ball, for mounting the solder balls on a work, the apparatus comprising at least:
   a stage on which the work is to be placed;
   a stage raising and lowering mechanism raising and lowering the stage;
   at least first and second mask frames holding the mask;
   a mask raising and lowering mechanism raising and lowering the second mask frame with respect to the ball holding holes;
   a ball supplying mechanism supplying the solder balls onto the mask;
   a positioning mechanism aligning the electrodes of the work with the ball holding holes;
   a mask vibrating mechanism vibrating the mask; and
   a ball collecting mechanism collecting excess solder balls from the mask,
   wherein the mask raising and lowering mechanism is capable of changing a shape of the mask by raising or lowering said second mask frame with respect to said first mask frame.

6. A solder ball mounting apparatus using a mask including a plurality of ball holding holes, each being passable by a solder ball, for mounting the solder balls on a work, the apparatus comprising at least:
   a stage on which the work is to be placed;
   a stage raising and lowering mechanism raising and lowering the stage;
   at least first and second mask frames holding the mask;
   a mask raising and lowering mechanism raising and lowering the second mask frame with respect to the first mask frame;
   a ball supplying mechanism supplying the solder balls onto the mask;
   a positioning mechanism aligning the electrodes of the work with the ball holding holes;
   a mask vibrating mechanism vibrating the mask; and
   a ball collecting mechanism collecting excess solder balls from the mask,
   wherein when a portion of the mask having the ball holding holes is held by the first mask frame in a position that is lower than other portions of the mask, the vibrating mechanism is capable of moving and distributing the solder balls into the ball holding holes.

7. The solder ball mounting apparatus according to claim 6, wherein the ball supplying mechanism supplying is a chute.

8. The solder ball mounting apparatus according to claim 6, wherein when the portion of the mask having the ball holding holes is held by the first mask frame in a position that is higher than other portions of the mask, the vibrating mechanism enables the ball collecting mechanism to collect the excess solder balls.

* * * * *